United States Patent
Nishi

(10) Patent No.: US 8,048,691 B2
(45) Date of Patent: Nov. 1, 2011

(54) WIRING FORMING METHOD

(75) Inventor: Yasuo Nishi, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 13/000,139

(22) PCT Filed: Jun. 16, 2009

(86) PCT No.: PCT/JP2009/060930
§ 371 (c)(1),
(2), (4) Date: Dec. 20, 2010

(87) PCT Pub. No.: WO2010/001715
PCT Pub. Date: Jan. 7, 2010

(65) Prior Publication Data
US 2011/0111588 A1    May 12, 2011

(30) Foreign Application Priority Data

Jun. 30, 2008  (JP) ................................ 2008-170753

(51) Int. Cl.
*H01L 21/00* (2006.01)
(52) U.S. Cl. .................. 438/21; 438/6; 347/54; 347/55; 347/64; 427/100; 427/123
(58) Field of Classification Search .............. 347/60–64, 347/54–55; 427/100, 123; 438/6, 21
See application file for complete search history.

(56) References Cited

U.S. PATENT DOCUMENTS

| | | | |
|---|---|---|---|
| 6,117,698 A * | 9/2000 | Atobe et al. | 438/21 |
| 6,737,287 B1 * | 5/2004 | Furuse et al. | 438/21 |
| 2004/0155326 A1 | 8/2004 | Kanbayashi | |
| 2005/0116069 A1 | 6/2005 | Murata | |

FOREIGN PATENT DOCUMENTS

| | | |
|---|---|---|
| CN | 1635933 A | 7/2005 |
| EP | 1477230 A1 | 11/2004 |
| JP | 4-81666 A | 3/1992 |
| JP | 2004-63569 A | 2/2004 |
| JP | 2004-165587 A | 6/2004 |
| JP | 2004-281539 A | 10/2004 |
| JP | 2005-302813 A | 10/2005 |
| JP | 3918936 B2 | 5/2007 |
| JP | 2007-335558 A | 12/2007 |
| TW | 224029 B | 11/2004 |
| WO | 03/070381 A1 | 8/2003 |

OTHER PUBLICATIONS

International Search Report for International Application No. PCT/JP2009/060930 mailed Sep. 15, 2009 with English translation.

* cited by examiner

*Primary Examiner* — Dung A. Le
(74) *Attorney, Agent, or Firm* — Cantor Colburn LLP

(57) ABSTRACT

Size reduction and high integration of each of the laminated substrates are achieved, while forming an excellent wiring which electrically connects the substrates to each other. A conductive ink, i.e., an ink, containing a conductive material is used, and in a state where a voltage is applied between a print head and a substrate unit, an ink droplet of the conductive ink is discharged from the print head, while relatively shifting the substrate unit and the print head substantially parallel to at least the upper surface of the substrate. Thus, a conductive layer which electrically connects electrodes to each other between the substrates is formed.

12 Claims, 7 Drawing Sheets

WIRING FORMING METHOD

CROSS REFERENCE TO RELATED APPLICATIONS

This is a U.S. national stage application of International Application No. PCT/JP2009/060930, filed on 16 Jun. 2009. Priority under 35 U.S.C. §119(a) and 35 U.S.C. §365(b) is claimed from Japanese Application No. JP2008-170753, filed 30 Jun. 2008, the disclosure of which is also incorporated herein by reference.

TECHNICAL FIELD

The present invention relates to a wiring forming method.

BACKGROUND

Over recent years, to respond to the needs of the realization of miniaturization and high integration of electronic parts, the development of a method for mounting semiconductor chips three-dimensionally is advancing. As such a method, a method via wire bonding is known in which for example, a plurality of semiconductor chip electrodes laminated are electrically connected together using wires.

However, in this method, the length limitation of wires themselves limits the shape of semiconductor chips and the position of electrodes. Further, it is necessary to ensure a space mainly in the height direction as an area for wiring.

Therefore, instead of wire bonding, some methods for forming a conductive layer in a wiring manner have been proposed in which conductive ink droplets are ejected from an ink-jet head between electrodes to connect the electrodes (for example, refer to Patent Documents 1-3). Any of these methods makes it possible to eliminate the above shape limitation using wires.

PRIOR ART DOCUMENTS

Patent Documents

Patent Document 1: Examined Japanese Patent Application Publication No. 3918936
Patent Document 2: Examined Japanese Patent Application Publication No. 4081666
Patent Document 3: Unexamined Japanese Patent Application Publication No. 2005-302813

BRIEF DESCRIPTION OF THE INVENTION

Problems to be Solved by the Invention

However, according to the methods described in above Patent Documents 1 and 2, since an ink-jet head is scanned parallel to the upper sides of semiconductor chips laminated in a staircase pattern, it is difficult to form conductive layers by continuously depositing ink droplets on the surfaces having an steep angle with respect to the ink ejection surface such as the side surfaces of the bump portions of the semiconductor chips. Even via continuous ink droplet deposition, especially when an angular portion is not deposited with an adequate amount of ink droplets, the ink, namely, a conductive layer is broken during drying in some cases. According to the method described in Patent Document 3, a taper-shaped resin portion is provided for the bump portions to eliminate the steep-angle surfaces. However, this method widens the bump portions in the width direction.

Further, a common on-demand ink-jet head has a short flying distance of ink droplets, which limits the laminating height of semiconductor chips, namely, substrates.

In view of the above circumstances, the present invention was completed, and the problem thereof is to provide a wiring forming method enabling to realize miniaturization and multi-lamination of substrates with formation of excellent wiring to electrically connect the laminated substrates to one another.

Means to Solve the Problems

To solve the above problem, the invention of item 1 is a wiring forming method in which ink droplets of an ink having chargeability is ejected from an ink-jet system print head and deposited on a plurality of substrates to form wiring to connect a plurality of the substrates, wherein a conductive layer forming step is provided in which using those which are laminated as a plurality of the substrates and also have electrodes on the upper surface or the side surface of each substrate showing an exposed surface, as well as using a conductive ink containing a conductive material as the ink, in the state of applying a voltage between the print head and a plurality of the substrates, while a plurality of the substrates and the print head are relatively shifted approximately parallel to at least the upper surfaces of the substrates, ink droplets of the conductive ink are ejected from the print head to form a conductive layer on the exposed surface to electrically connect the electrodes to one another among the substrates.

The invention of item 2 is the wiring forming method described in item 1, wherein the conductive ink has an electrical conductivity of at least 0.1 μS/cm and a specific dielectric constant of at least 10, and an ink droplet of the conductive ink to be ejected has a volume of 0.001 pl-1 pl.

The invention of item 3 is the wiring forming method described in item 1 or 2, wherein a voltage applied between the print head and a plurality of the substrates is less than the insulation breakdown voltage of air.

The invention of item 4 is the wiring forming method described in any of items 1-3, wherein as a plurality of the substrates, substrates laminated so as for the end portions to be arranged in a staircase pattern are used and the maximum diameter on deposition of an ink droplet of the conductive ink to be ejected is at most half of each of the bump portions of the step-like portions.

The invention of item 5 is the wiring forming method described in any of items 1-4, wherein when a plurality of the substrates and the print head are relatively shifted approximately parallel to the upper surfaces of the substrates, ink droplets of the conductive ink are ejected from the print head at an ejection frequency $f_1$ satisfying following Expression (1):

$$f_1 = V(L_1 + L_2 - rD)/\{DL_2(1-r)\} [\text{Hz}] \qquad (1)$$

wherein D represents the diameter on deposition of an ink droplet of the conductive ink to be ejected; $L_1$ represents the total length of the conductive layer formed on each of the side surfaces of a plurality of the substrates; $L_2$ represents the total length of the conductive layer formed on each of the upper surfaces of a plurality of the substrates; r represents a ratio of the radius direction maximum length of ink droplets to the diameter D in a portion where ink droplets of the conductive ink having been continuously deposited are overlapped; and V represents the relative speed of a plurality of the substrates and the print head.

The invention of item 6 is the wiring forming method described in item 5, wherein when the conductive layer is formed on each of the side surfaces of a plurality of the substrates, ink droplets of the conductive ink are ejected at an ejection frequency $f_1$ satisfying above Expression (1), and when the conductive layer is formed on each of the upper surfaces of a plurality of the substrates, ink droplets of the conductive ink are ejected at an ejection frequency $f_2$ satisfying following Expression (2):

$$f_2 = V(L_1 + L_2 - rD)/\{D(L_1 + L_2)(1-r)\} \text{[Hz]} \quad (2)$$

The invention of item 7 is the wiring forming method described in any of items 1-6, wherein prior to the conductive layer forming step, an insulating layer forming step is provided in which using an insulating ink containing an insulating material as the ink, in the state of applying a voltage between the print head and a plurality of the substrates, while a plurality of the substrates and the print head are relatively shifted approximately parallel to at least the upper surfaces of the substrates, ink droplets of the insulating ink are ejected from the print head to form an insulating layer on the exposed surface to insulate the substrates and the conductive layer.

The invention of item 8 is the wiring forming method described in item 7, wherein the insulating ink has an electrical conductivity of at least 0.1 μS/cm and a specific dielectric constant of at least 10, and an ink droplet of the insulating ink to be ejected has a volume of 0.001 pl-1 pl.

The invention of item 9 is the wiring forming method described in item 7 or 8, wherein the insulating layer is formed only in a portion where the conductive layer is formed.

The invention of item 10 is the wiring forming method described in any of items 7-9, wherein the insulating layer is formed with a single insulating material.

The invention of item 11 is the wiring forming method described in any of items 7-10, wherein after the insulating layer forming step, a surface treatment step is provided prior to the conductive layer forming step.

The invention of item 12 is the wiring forming method described in any of items 1-11, wherein the substrates are semiconductor chips.

Effects of the Invention

According to the invention described in item 1, using a conductive ink containing a conductive material as an ink, in the state of applying a voltage between a print head and a plurality of substrates, ink droplets are ejected, whereby a conductive layer is formed on an exposed surface to electrically connect electrodes to one another among the substrates. Thereby, by applying an electrostatic attractive force, moving toward the substrates, to ink droplets having been ejected from the print head, ink droplets can continuously be deposited even on the surfaces having a steep angle with respect to the ink ejection surface of the print head without providing a taper member to reduce the angle. Especially, an adequate amount of ink droplets can be deposited on the angular portions where electrical force lines are concentrated. Therefore, miniaturization of the laminated substrates can be realized with formation of excellent wiring to electrically connect each laminated substrate.

Further, since ink droplets are ejected in the state of applying a voltage between a print head and a plurality of substrates, compared to the conventional on-demand ink-jet head with no applied electrostatic attractive force, the flying distance of ink droplets can be extended. Therefore, high loading of substrates can be realized.

According to the invention described in item 2, a conductive has an electrical conductivity of at least 0.1 μS/cm and a specific dielectric constant of at least 10 and an ink droplet of the conductive ink to be ejected has a volume of 0.001 pl-1 pl, whereby an attractive force adequate for deposition on substrates along electrical force lines can be allowed to act on ink droplets with inhibited air resistance and inertia force acting on the ink droplets. Therefore, more excellent wiring can be formed to electrically connect each laminated substrate.

According to the invention described in item 3, a voltage applied between a print head and a plurality of substrates is less than the insulation breakdown voltage of air, which causes no electrical short circuit. Therefore, wiring can stably be formed.

According to the invention described in item 4, the maximum diameter on deposition of an ink droplet to be ejected is at most half of each of the bump portions of the step-like portions, whereby at least 2 ink droplets are deposited on each bump portion, and thereby differently from the case of depositing one ink droplet, the ink is prevented from becoming wet and spreading in the bump portion to a large extent. Therefore, high precision wiring can be formed to electrically connect each laminated substrate.

According to the invention described in item 5, when a plurality of substrates and a print head are relatively shifted approximately parallel to the upper surfaces of the substrates, ink droplets of a conductive ink are ejected from the print head at an ejection frequency $f_1 = V(L_1 + L_2 - rD)/\{DL_2(1-r)\}$ [Hz], whereby ink droplets are ejected only at an ejection frequency in which the ejection frequency $V(L_1 + L_2 - rD)/\{DL_2(1-r)\}$ [Hz] of ink droplets having been continuously deposited so as to be overlapped on the surface parallel to the ink ejection surface at a length rD is multiplied by $(L_1 + L_2)/L_2$. In such a manner, ink droplets are ejected at an adequate amount for deposition on the side surfaces of substrates where ink droplets are hard to deposit. Therefore, under simple print head drive conditions, excellent wiring can certainly be formed to electrically connect each laminated substrate. Incidentally, in actual wiring formation, the electrode position is previously aligned and then the first shot of ink droplets is allowed to be deposited on the electrode. Thereafter, the ejection frequency $f_1$ is memorized in the control member of the print head and then ink droplets are ejected at the ejection frequency $f_1$.

According to the invention described in item 6, when a conductive layer is formed on each of the side surfaces of a plurality of substrates, ink droplets of a conductive ink are ejected at the ejection frequency $f_1$, and when a conductive layer is formed on each of the upper surfaces of a plurality of substrates, ink droplets of a conductive ink are ejected at an ejection frequency $f_2 = V(L_1 + L_2 - rD)/\{D(L_1 + L_2)(1-r)\}$ [Hz], whereby as ink droplets are ejected at an adequate amount for deposition on each of the side surfaces of the substrates when ink droplets are hard to deposit, an appropriate amount of ink droplets can be ejected on each of the upper surfaces where ink droplets are easy to deposit. Therefore, excellent wiring can certainly and efficiently be formed to electrically connect each laminated substrate. Incidentally, in actual wiring formation, the electrode position is previously aligned and then the first shot of ink droplets is allowed to be deposited on the electrode. Thereafter, the ejection frequencies $f_1$ and $f_2$ are memorized in the control member of the print head and then ink droplets are ejected as the ejection frequencies $f_1$ and $f_2$ are switched.

According to the invention described in item 7, prior to a conductive layer forming step, using an insulating ink containing an insulating material as an ink, ink droplets are ejected in the state of applying a voltage between a print head and a plurality of substrates to form an insulating layer on the exposed surface to insulate the substrates and a conductive layer. Thereby, by applying an electrostatic attractive force, moving toward the substrates, to ink droplets having been ejected from the print head, ink droplets can continuously be deposited even on the surfaces having a steep angle with respect to the ink ejection surface of the print head without providing a taper member to reduce the angle. Especially, an adequate amount of ink droplets can be deposited on the angular portions where electrical force lines are concentrated. Therefore, miniaturization of the laminated substrates can be realized with formation of an excellent insulating layer to insulate the substrates and a conductive layer.

Further, since ink droplets are ejected in the state of applying a voltage between a print head and a plurality of substrates, compared to the conventional on-demand ink-jet head with no applied electrostatic attractive force, the flying distance of ink droplets can be extended. Therefore, high loading of substrates can be realized.

According to the invention described in item 8, an insulating ink has an electrical conductivity of at least 0.1 µS/cm and a specific dielectric constant of at least 10, and an ink droplet of the insulating ink to be ejected has a volume of 0.001 pl-1 pl. Thereby, an attractive force adequate for deposition on substrates along electrical force lines can be applied to ink droplets with inhibited air resistance and inertia force acting on the ink droplets. Therefore, an excellent insulating layer to insulate the substrates and a conductive layer can certainly is formed on each laminated substrate.

According to the invention described in item 9, an insulating layer is formed only in a portion where a conductive layer is formed, whereby the insulating layer is formed only in a portion which needs to be insulated. Therefore, an insulating layer is efficiently formed.

According to the invention described in item 10, an insulating layer is formed with a single insulating material, whereby the wetting and charged state of conductive ink droplets forming a conducting layer on the insulating layer becomes uniform. Therefore, excellent wiring to electrically connect each laminated substrate can stably be formed.

According to the invention described in item 11, after an insulating layer forming step, surface treatment, to enhance adhesion properties of a conductive ink, is carried out for the surface of an insulating layer prior to a conductive layer forming step, whereby adhesion properties of ink droplets of this conductive ink is enhanced and also the wetting and charged state of the ink droplets become uniform. Therefore, excellent wiring to electrically connect each laminated substrate can stably be formed.

DESCRIPTION OF THE PREFERRED EMBODIMENT

With reference to the drawings, the embodiment of the present invention will now be described.

Initially, the entire constitution of an ink-jet apparatus 1 according to the present embodiment will now be described with reference to FIGS. 1 and 2.

Figure 1:
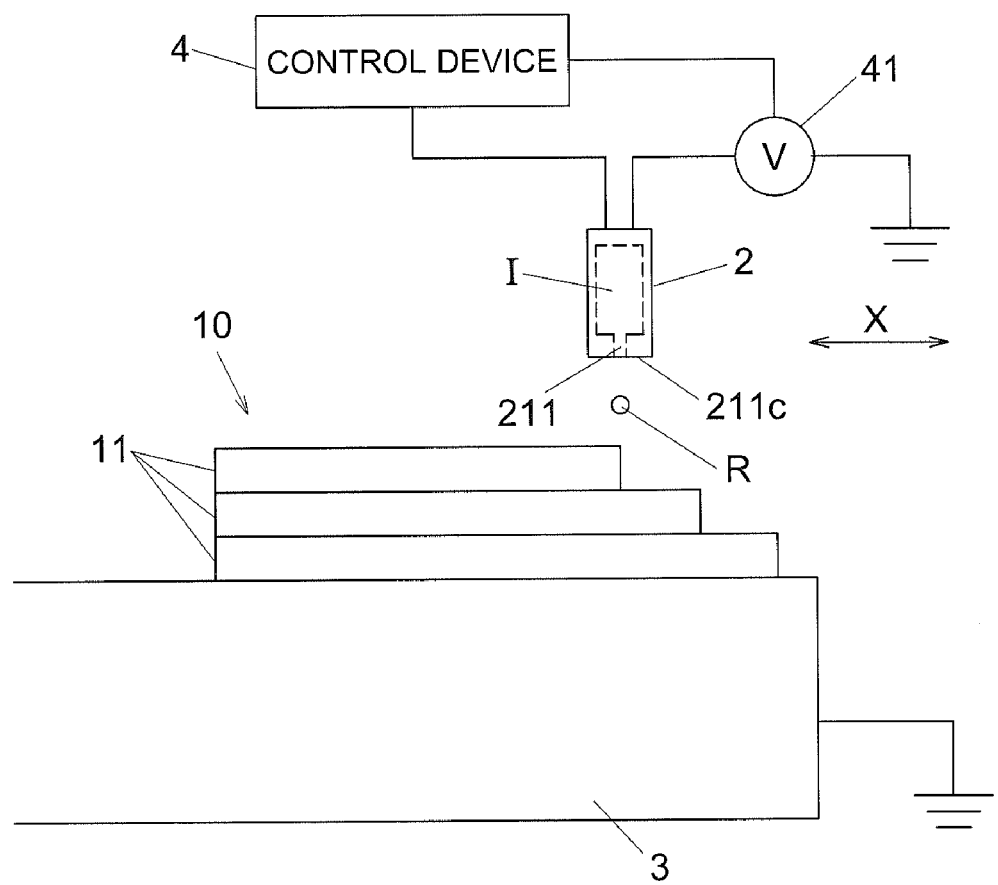
FIG. 1 is a schematic view showing the entire constitution of an ink-jet apparatus in an embodiment.

FIG. 1 is a schematic view showing the entire constitution of the ink-jet apparatus 1 and FIG. 2 is a perspective view of a substrate unit 10 to be described later.

As shown in FIG. 1, the ink-jet apparatus 1 is provided with a print head 2 in which a nozzle 211 is formed to eject ink droplets R of an ink I having chargeability and an opposite surface opposed to the nozzle 211 of the print head 2, as well as an opposite electrode 3 supporting a substrate unit 10 in which ink droplets R are deposited on the opposite surface and a control member 4 to drive the print head 2 to eject ink droplets R from the nozzle 211. This ink-jet apparatus 1 allows ink droplets R having conductivity to be deposited on a substrate unit 10 for wiring formation of the substrate unit 10.

The opposite electrode 3 is flat plate-shaped supporting a substrate unit 10 and arranged parallel to the ink ejecting surface 211c of the print head 2 with a predetermined clearance distance. The clearance distance between the opposite electrode 3 and the print head 2 is appropriately set in the range of about 0.1-5.0 mm. Further, the opposite electrode 3 is grounded and always maintained at the ground potential. Thereby, as described later, when charged ink droplets R are deposited on a substrate unit 10, the opposite electrode 3 allows the charge to escape via grounding. Herein, the opposite electrode 3 is equipped with an unshown positioning member to position the substrate unit 10. Further, the opposite electrode 3 can be shifted parallel to the plane when the substrate unit 10 is placed.

The control member 4 is a computer containing an unshown CPU, ROM, and RAM, and is connected to an electrostatic voltage power source 41 to apply an electrostatic voltage to the print head 2 and a piezoelectric element 23, to be described later, of the print head 2. This control member 4 applies an electrostatic voltage to the print head 2 by controlling the electrostatic voltage power source 41 to generate an electrostatic field between the nozzle plate 21 and the opposite electrode 3 and also to eject ink droplets R from the nozzle 211 by controlling the deformation of the piezoelectric element 23. Further, the control member 4 can control the scanning of the print head 2. Herein, a voltage applied by the electrostatic voltage power source 41 may be direct or alternating current. Further, it is possible that the electrostatic voltage power source 41 is connected to the opposite electrode 3 to apply a voltage to the opposite electrode 3 and the print head 2 is grounded. Still further, in the state when the print head 2 is fixed, the control member 4 may carry out scan-controlling of the stage (the placement plane of a substrate unit 10) of the opposite electrode 3.

The ink I is an ink exhibiting conductivity and chargeability by containing a metal nanoparticle. As this metal nanoparticle, listed are, for example, silver, gold, cupper, palladium, platinum, nickel, rhodium, tin, and indium, or alloys thereof.

The production method of such a metal nanoparticle is roughly divided into 2 types. One is a physical method and the other is a chemical method. The physical method is a method to produce nanoparticles by commonly pulverizing bulk metal. The chemical method is a method to produce nanoparticles in which metal atoms are generated and their aggregation is controlled.

The chemical method is roughly categorized into a wet method carried out in liquid and a dry method carried out in air or under reduced pressure ambience. A chemical reduction method known as a wet method is a method to produce nanoparticles in which a reducing agent is added to a metal ion solution or a metal salt solution containing a reducing agent is heated to reduce metal ions. As an ink containing such nanoparticles, an ink as disclosed in Examined Japanese Patent Application Publication No. 3933138 is usable. As the dry method, an in-gas evaporation method is known. The in-gas evaporation method is a method to produce nanoparticles in which a metal is evaporated in an inert gas and then cooled and aggregated via collision with the gas. It is known that the dry method can allow particle diameter to be smaller than the wet method. The dry method can allow the particle diameter to become even several nm.

The particle diameter of a metal nanoparticle in an ink I used for the present embodiment is 1-100 nm, preferably 1-50 nm. A metal nanoparticle of a particle diameter of less than 1 nm can be used. However, such a particle is extremely difficult to produce, being therefore unpractical. Further, when a metal nanoparticle having a particle diameter of more than 100 nm is used, the nozzle 211 may be clogged.

The concentration of a metal nanoparticle contained in the ink I is preferably high so that the resistance value of a conductive layer 12, to be described later, formed by drying the ink I becomes a value close to the resistance value of an electrode 112. Specifically, the value is preferably at least 10% by weight, more preferably 20% by weight. Herein, the concentration of this metal nanoparticle can be allowed to be up to about 80% by weight.

In the ink I, as a solvent allowed to contain a metal nanoparticle, water or a water-soluble organic solvent is used. Such a so-called aqueous ink exhibits excellent electrical conductivity compared to an oil-based ink employing a nonpolar solvent. Further, this solvent preferably exhibits lower vapor pressure and higher boiling point so that the viscosity of the ink I does not easily increase and drying does not easily occur. The boiling point of the solvent is preferably at least 150° C., more preferably at least 200° C. The water content is preferably at most 40% by weight from the viewpoint of drying performance.

The viscosity of the ink I is, at the ejection temperature, preferably 2 mPa·s-10 mPa·s, more preferably 3 mPa·s-6.5 mPa·s from the viewpoint of ejection stability. The ejection temperature is preferably 20-60° C., more preferably 25-50° C. In the case of less than 25° C., cooling is required in some cases. In the case of more than 50° C., the print head 2 and the flow path member of the ink I may be burdened.

The surface tension of the ink I is preferably 20 mN/m-50 mN/m, being, however, more preferably 25 mN/m-45 mN/m from the viewpoint of ejection stability.

The electrical conductivity of the ink I is, to allow electrostatic attraction force to act, preferably 0.1 µS/cm-2000 µS/cm, being, however, more preferably 1 µS/cm-1000 µS/cm from the viewpoint of high precision drawing.

The specific dielectric constant of the ink I is preferably at least 10.

Figure 2A:
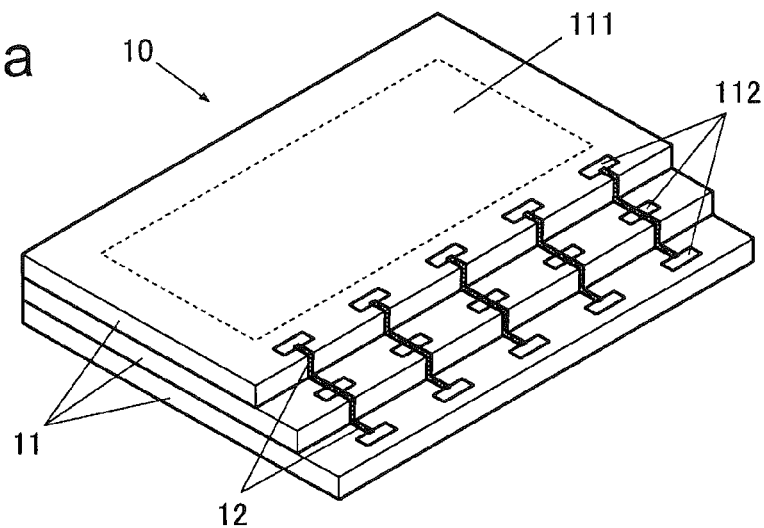
FIGS. 2a through 2c are perspective views of a substrate unit in the embodiment.

As shown in FIG. 2A, a substrate unit 10 is produced by laminating a plurality of substrates 11 so as for the side portions to be formed in a staircase pattern. In the present embodiment, 3-step lamination is carried out. The substrates 11 are not specifically limited, which are semiconductor chips and may be semiconductor wafers. On the substrates 11, a plurality of integrated circuits (for example, circuits having a transistor and memory) 111 and a plurality of electrodes (for example, pads) 112 are mounted.

Further, in the substrates 11, at least one insulating film (not shown) is formed. This insulating film is referred to as a passivation film, which is formed, for example, using $SiO_2$, $Si_3N_4$, or a polyimide resin. Herein, the insulating film allows at least part of an electrode 112 to be exposed.

The electrode 112 is provided on the upper surface of each substrate 11 exposed in the step-like portion. In the present embodiment, the same number of the electrodes is arranged in each substrate 11. Each electrode 112 is electrically connected with an integrated circuit 111. Further, the electrode 112 is formed of an aluminum-based or cupper-based metal and with no limitation, the surface shape is rectangular.

This electrode 112 is electrically mutually connected to another electrode 112 corresponding thereto among substrates 11 via a conductive layer 12. The conductive layer 12 is formed, by a method to be described later, via drying of ink droplets R of an ink I having been ejected from the print head 2. In the present embodiment, this conductive layer 12 is formed at least on the upper surface and the side surface of each substrate 11 in the step-like portion.

Figure 2B:
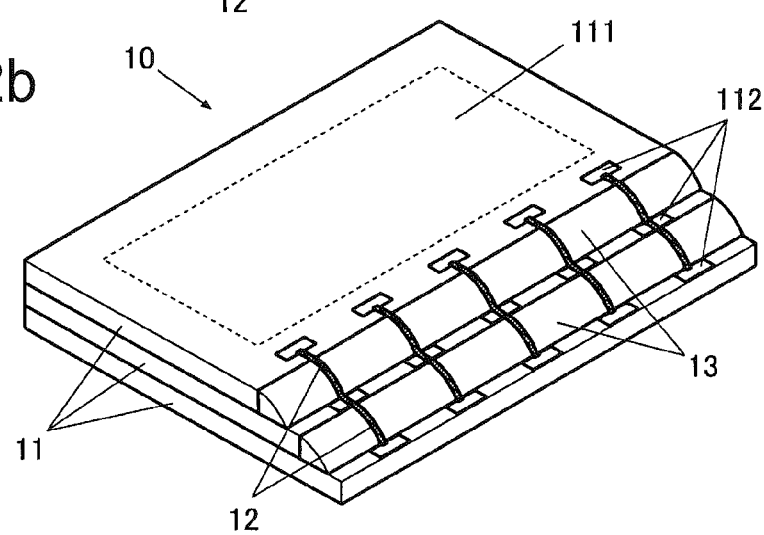
Figure 2C:
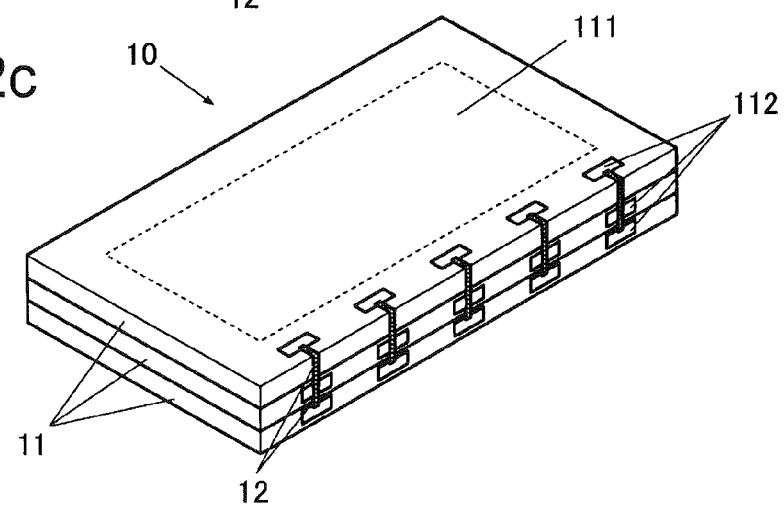

Herein, as shown in FIG. 2B, the substrate unit 10 may be provided with taper-shaped insulating members 13 in the step-like bump portions, or lamination may be carried out by matching the outer circumference of each substrate 11 as shown in FIG. 2C. However, in the latter case, each electrode 112 of the substrates 11 except the top one is provided on the exposed side surfaces of the substrates 11.

Subsequently, the constitution of a print head 2 will now be described with reference to FIGS. 3 and 4.

Figure 3:
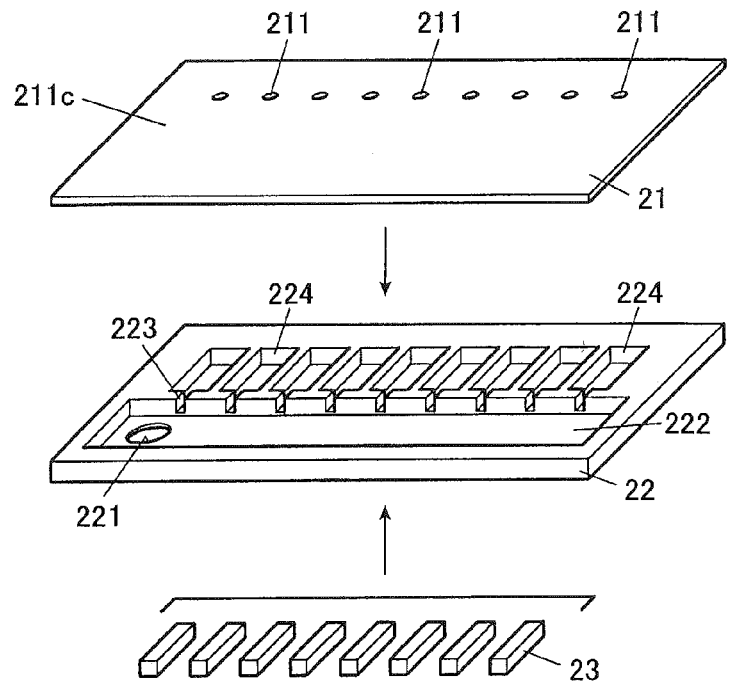
FIG. 3 is an exploded perspective view of a print head.
Figure 4:
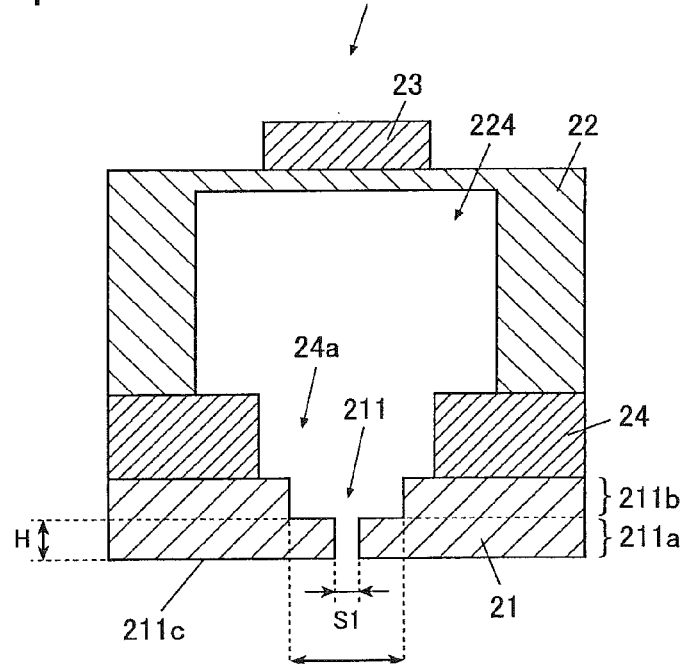
FIG. 4 is a side sectional view of the print head.

FIG. 3 is an exploded perspective view of the print head 2, and FIG. 4 is a side sectional view of the print head 2.

As shown in FIG. 3, the print head 2 has a nozzle plate 21, a body plate 22, and piezoelectric elements 23. The nozzle plate 21 is a silicon substrate or a silicon oxide substrate having a thickness of about 150-300 µm. A plurality of nozzles 211 are formed in the nozzle plate 21 and a plurality of these nozzles 211 are arranged in a line.

The body plate 22 is a silicon substrate having a thickness of about 200-500 µm. In the body plate 22, an ink supply orifice 221, an ink reservoir 222, a plurality of ink supply paths 223, and a plurality of pressure chambers 224 are formed. The ink supply orifice 221 is a circular penetrated hole of a diameter of about 400-1500 µm The ink reservoir 222 is a groove having a width of about 400-1000 µm and a depth of about 50-200 µm. The ink supply path 223 is a groove having a width of about 50-150 µm and a depth of about 30-150 µm. The pressure chamber 224 is a groove having a width of about 150-350 µm and a depth of about 50-200 µm.

The nozzle plate 21 and the body plate 22 are formed so as to be bonded together. In the bonded state, the nozzles 211 of the nozzle plate 21 and the pressure chambers 224 of the body plate 22 are formed so as to correspond one-on-one.

In the state where the nozzle plate 21 and the body plate 22 are bonded together, an ink is supplied to the ink supply orifice 221 and then the ink is temporally reserved in the ink reservoir 222. Thereafter, the ink is supplied to each pressure chamber 224 through each ink supply path 223 from the ink reservoir 222.

The piezoelectric element 23 is formed so as to be allowed to adhere to the position corresponding to each pressure chamber 223 of the body plate 22. The piezoelectric element 23 is an actuator formed of PZT (lead zirconium titanate) and is deformed via voltage application to eject an ink within the pressure chamber 224 from the nozzle 211.

Herein, although not shown in FIG. 3, a borosilicate glass plate 24 (refer to FIG. 4) is present between the nozzle plate 21 and the body plate 22.

As shown in FIG. 4, one nozzle 211 and one pressure chamber 224 each are constituted corresponding to one piezoelectric element 23.

In the nozzle plate 21, steps are formed in the nozzle 211 and the nozzle 211 is constituted of a lower step portion 211a and an upper step portion 211b. The lower step portion 211a and the upper step portion 211b each are circularly shaped. The diameter S1 (the distance in the horizontal direction in FIG. 4) of the lower step portion 211a is smaller than the diameter S2 (the distance in the horizontal direction in FIG. 4) of the upper step portion 211b.

The lower step portion 211a of the nozzle 211 is a section to directly eject an ink having flowed from the upper step portion 211b. The diameter S1 of the lower step portion 211a is 1-10 μm and the length H (the distance in the vertical direction in FIG. 4) thereof is 1.0-5.0 μm. The reason why the height H of the lower step portion 211a is limited in the range of 1.0-5.0 μm is that ink deposition accuracy can be enhanced dramatically.

On the other hand, the upper step portion 211b of the nozzle 211 is a section to allow an ink having flowed from the pressure chamber 224 to flow to the lower step portion 211a, and the diameter S2 thereof is 10-60 μm. The reason why the lower limit of the diameter S2 of the upper step portion 211b is limited to be at least 10 μm is that in the case of less than 10 μm, with respect to the flow channel resistance of the entire nozzle 211 (the lower step portion 211a and the upper step portion 211b), the flow channel resistance of the upper step portion 211b becomes a value which is not negligible, whereby the ejection efficiency of the ink is decreased.

In contrast, the reason why the upper limit of the diameter S2 of the upper step portion 211b is limited to be at most 60 μm is that as the diameter S2 of the upper step portion 211b is increased, the lower step portion 211a, serving as the ink ejection section, becomes thinner and weaker (due to the area increase of the lower step portion 211a, mechanical strength is decreased), whereby the deformation thereof easily occurs during ink ejection, resulting in a decrease in ink deposition accuracy. Namely, when the upper limit of the diameter S2 of the upper step portion 211b exceeds 60 μm, with ink ejection, the deformation of the lower step portion 211a occurs to a very large extent, whereby it may be impossible to allow the deposition accuracy to fall within a specified value (±0.5° with respect to a desired ejection direction).

A borosilicate glass plate 24 of a thickness of several hundred μm is provided between the nozzle plate 21 and the body plate 22. An opening portion 24a to communicatively connect the nozzle 211 and the pressure chamber 224 is formed in the borosilicate glass plate 24. The opening portion 24a is a penetrated hole leading from the pressure chamber 224 to the upper step portion 211b of the nozzle 211, being a section functioning as a flow channel to pass an ink from the pressure chamber 224 toward the nozzle 211. The pressure chamber 224 is a section to apply pressure to the ink within the pressure chamber 224 via the deformation of the piezoelectric element 23.

In the print head 2 having the above constitution, when the piezoelectric element 23 is deformed, a pressure is applied to an ink within the pressure chamber 224, and then the ink is passed from the pressure chamber 224 to the opening portion 24a of the borosilicate glass plate 24 to reach the nozzle 211, whereby finally, the ink is ejected from the lower step portion 211a of the nozzle 211.

Incidentally, the print head 2 is provided for the apparatus main body so as to be scanned in the direction parallel to the ink ejection surface 211c (in the X direction of FIG. 1).

Next, a wiring forming method to form a conductive layer 12 on a substrate unit 10 will now be described with reference to FIGS. 5 and 6.

Figure 5:
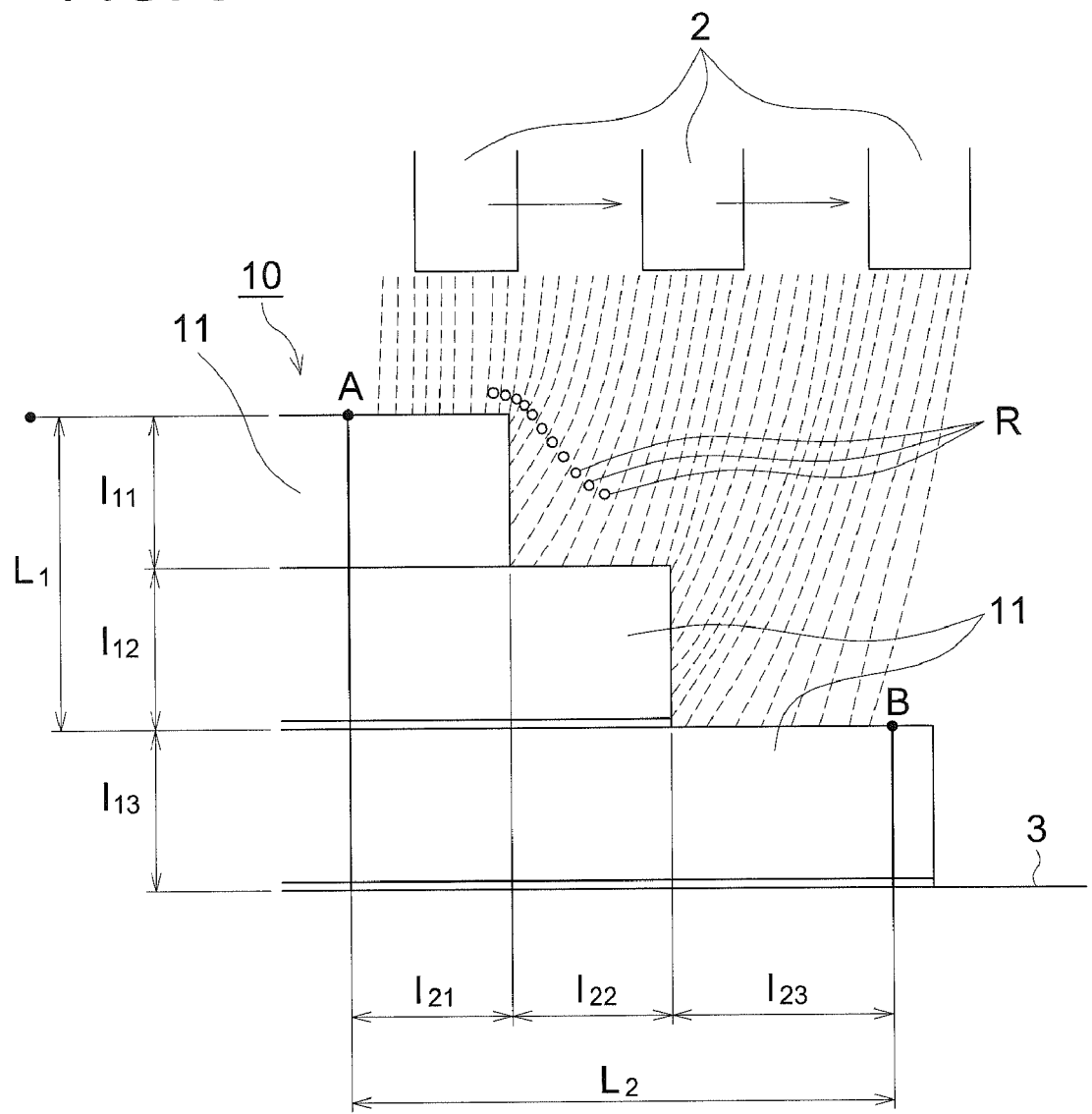
FIG. 5 is a view illustrating how ink droplets are deposited on the side surfaces of substrates.

FIG. 5 is a view illustrating how ink droplets R are deposited on the side surfaces of substrates 11. FIG. 6 is a view illustrating how ink droplets R are deposited on the bump portion of a substrate unit 10.

Initially, the following conductive layer forming step is performed to deposit ink droplets R, becoming a conductive layer 12, on a substrate unit 10 from the ink-jet apparatus 1.

First, a substrate unit 10 is positioned and fixed to the opposite electrode 3. Then, an electrostatic voltage is applied to the print head 2 by controlling the electrostatic power source 41 using the control member 4 to generate an electrostatic field between the nozzle plate 21 and the opposite electrode 3. In this case, attention should be made so that the potential difference produced between the print head 2 and the substrate 11 is less than the insulation breakdown voltage of air (about 3 kV/mm).

In this state, as sown in FIG. 5, as the print head 2 is scanned, above the step-like portions of the substrate unit 10, parallel to the upper surfaces of the substrates 11 in the direction of increasing the gap with respect to the substrates 11, ink droplets R are ejected from the nozzle 211. Then, by an electrostatic field between the nozzle plate 21 and the opposite electrode 3, electrical force lines as shown by dashed lines of the drawing are formed between the print head 2 and the substrate unit 10, whereby ink droplets R having been applied with an electrostatic force fly in the direction along these electric force lines to deposit on the substrates 11. Herein, the scanning initiation position of the print head 2 is set so that the first shot of ink droplets R is deposited on electrodes 112 of the top substrate 11 (refer to FIGS. 2 and 8). Further, the diameter on deposition of ink droplet R depends on physical properties of an ink I and the surface energy or surface state of a substrate 11 where deposition is made. When deposition is made on a substrate 11 not absorbing an ink I, the above diameter is about 1.5-4.0 times of the diameter during flying.

In this manner, an electrostatic attractive force, moving toward the substrates 11, is applied to ink droplets R having been ejected, whereby the ink droplets R can continuously be deposited even on the side surfaces of the substrates 11 having a steep angle with respect to the ink ejection surface 211c of the print head 2 without providing a taper member to reduce the angle. Especially, an adequate amount of ink droplets R can be deposited on the angular portions where electrical force lines are concentrated.

In this case, the ejection frequency of the print head 2 to eject ink droplets R is determined, based on the shape of the step-like portion, as follows:

The case of forming a conductive layer 12 from point A to point B shown in FIG. 5 is taken into account. In this case, when a conductive layer 12 is formed on the side surfaces of substrates 11, ink droplets R are ejected at a frequency $f_1$ satisfying following Expression (1). When a conductive layer 12 is formed on each of the upper surfaces of the substrates 11, ink droplets R are ejected at a frequency $f_2$ satisfying following Expression (2).

$$f_1 = V(L_1 + L_2 - rD) / \{DL_2(1-r)\} [\text{Hz}] \quad (1)$$

$$f_2 = V(L_1 + L_2 - rD) / \{D(L_1 + L_2)(1-r)\} [\text{Hz}] \quad (2)$$

wherein D represents the diameter on deposition of an ink droplet R to be ejected; $L_1$ represents the total length of a conductive layer 12 formed on the side surfaces of the substrates 11; $L_2$ represents the total length of a conductive layer 12 formed on the upper surfaces of the substrates 11; r represents a ratio of the radius direction maximum length of ink droplets R to the diameter D in a portion where ink droplets R having been continuously deposited are overlapped (refer to FIG. 6A and herein, this drawing shows the state of immediately prior to deposition of ink droplet R); and V represents the scanning speed of the print head.

These ejection frequencies $f_1$ and $f_2$ are memorized in the control member 4 and appropriately switched via control of the piezoelectric elements 23 by the control member 4.

For example, in the case where D=0.01 mm, $L_1=l_{11}+l_{12}=0.5$ mm, $L_2=l_{21}+l_{22}+l_{23}=1$ mm, V=33.3 mm/sec, r=0.5, $l_{11}=0.3$ mm, $l_{12}=0.2$ mm, $l_{21}=0.4$ mm, $l_{22}=0.2$ mm, and $l_{23}=0.4$ mm, initially, as the print head 2 is shifted from the state of being located above point A at a scanning rate V, ink droplets R are ejected on the upper surface of the top substrate 11 at an ejection frequency $f_2=33.3(0.5+1-0.5\times0.01)/\{0.01\times(0.5+1)\times(1-0.5)\}\approx6700$ Hz=6.7 kHz. When a necessary number of shots, namely, $(l_{21}-rD)/\{D(1-r)\}=(0.4-0.005)/(0.01\times0.5)=79$ shots of ink droplets R are ejected, switching is made to an ejection frequency $f_1=33.3(0.5+1-0.5\times0.01)/\{0.01\times1\times(1-0.5)\}\approx10000$ Hz=10 kHz, whereby ink droplets R are ejected on the side surface of the top substrate 11. Also, in this case, when the ejection of a necessary number of shots, namely, $(l_{11}-rD)/\{D(1-r)\}=(0.3-0.005)/(0.01\times0.5)=59$ shots of ink droplets R is terminated, switching is again made to a ejection frequency $f_2=6.7$ kHz. In this manner, with respect to the upper surface and the side surface of the middle surface 11 and the upper surface of the bottom substrate 11, as the ejection frequencies $f_1$ and $f_2$ are appropriately switched for each, ink droplets R are continuously ejected and deposited until reaching point B.

In this manner, as the ejection frequencies $f_1$ and $f_2$ are appropriately switched, ink droplets R are ejected, whereby as ink droplets R are ejected at an adequate amount to be deposited on the side surfaces of substrates 11 where ink droplets R are hard to deposit, an appropriate amount of ink droplets R can be ejected on the upper surfaces of the substrates 11 where ink droplets R are easy to deposit.

Incidentally, ink droplets R may be ejected at a constant ejection frequency $f_1$. Even under this single print head 2 drive condition, ink droplets R can be ejected at an adequate amount to be deposited on the side surfaces of substrates 11 where ink droplets R are hard to deposit.

Figure 6A:
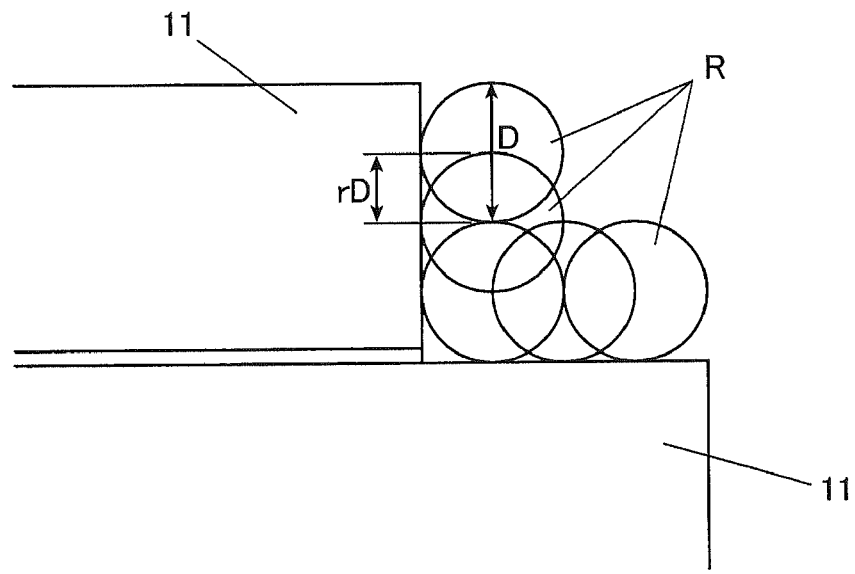
FIG. 6 includes a view showing (a) the moment when a plurality of ink droplets have been deposited on the bump portion of a substrate unit and a view showing (b) the moment when one ink droplet has been deposited thereon.
Figure 6B:
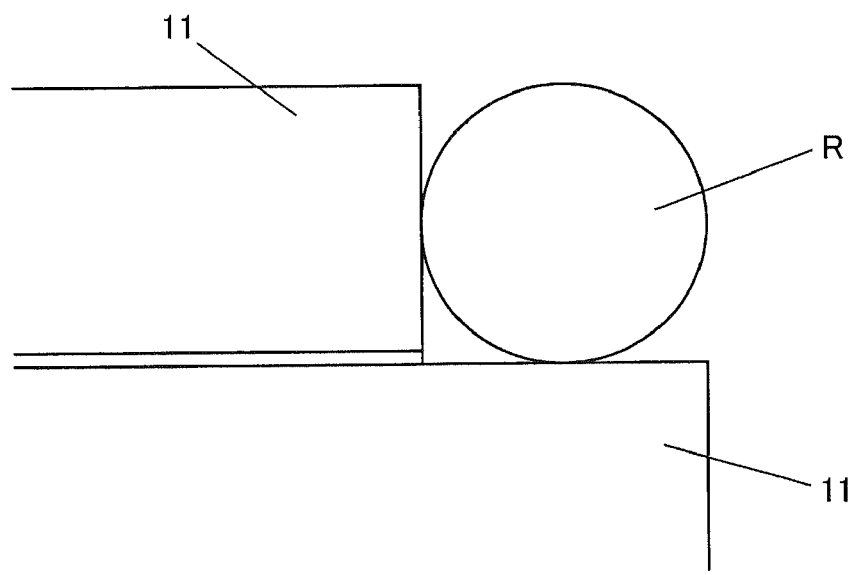

Further, with regard to ink droplets R to be ejected on the step-like portions, as shown in FIG. 6A, the maximum diameter on deposition is preferably at most half of each bump portion of the step-like portions. As shown in FIG. 6B, if only one ink droplet R is deposited on the step-like portion, this ink droplet R becomes wet and spreads on the step-like portion to a large extent. Therefore, an ink droplet R is ejected so that the maximum diameter thereof is at most half of each bump portion of the step-like portion, whereby at least 2 ink droplets R are deposited on the each bump portion. Thereby, the ink can be prevented from being wet and spreading on the bump portion.

Further, an ink droplet R to be ejected preferably has a volume of 0.001 pl-1 pl. Thereby, air resistance and inertia force acting on the ink droplet can be inhibited.

After the conductive layer forming step has been terminated by depositing ink droplets R on the substrate unit 10, the ink droplets R are fired. The firing method includes firing using a dryer or a hot plate. In the present embodiment, to control the wettability of an ink I to enhance deposit performance, a subbing agent (a silane coupling agent or titanium coupling agent) is coated on substrates 11. Therefore, firing is preferably carried out under conditions to ensure the heat resistance of various types of coupling agents.

In such firing, it is preferable to carry out predrying at 100-150° C. for 10-30 minutes and then main drying at 150-200° C. for 60-180 minutes. When no predrying is carried out, a solvent remains in a fused metal, whereby the resistance value may be increased. When the temperature of predrying is less than 100° C., almost no solvent is evaporated, whereby no effect may be produced. At a temperature of more than 150° C., fusion of metal nanoparticles may be initiated. When the temperature of main drying is less than 150° C., no fusion of the metal nanoparticles occurs, whereby the resistance value may be increased. At a temperature of more than 200° C., a subbing agent is degraded and thereby mixing with a fused metal occurs, resulting in the possibility of an increase in the resistance value. For main drying, a hot plate is preferably used. The reason is that use of a hot plate makes it possible that heat is directly transferred to an ink I, resulting in acceleration of fusion of metal nanoparticles.

Via the above firing, the solvent of ink droplets R is evaporated, whereby a conductive layer 12 is fixed to the substrate unit 10.

As describe above, according to the firing forming method of the present embodiment, ink droplets R can continuously be deposited even on the side surfaces of substrates 11 having a steep angle with respect to the ink ejection surface 211c of the print head 2 without providing a taper member to reduce the angle. Especially, an adequate amount of ink droplets R can be deposited on the angular portions where electrical force lines are concentrated. Therefore, miniaturization of a substrate unit 10 can be realized with formation of excellent wiring to electrically connect each laminated substrate 11.

Further, ink droplets R are ejected in the state of applying a voltage between the print head 2 and the substrates 11, whereby compared to the conventional on-demand ink-jet head with no applied electrostatic attractive force, the flying distance of ink droplets R can be extended. Therefore, high loading of substrates 11 can be realized.

Further, the ink I has an electrical conductivity of at least 0.1 μS/cm and a specific dielectric constant of at least 10, and an ink droplet to be ejected has a volume of 0.001 pl-1 pl. Thereby, an attractive force adequate for deposition on the substrates 11 along electrical force lines can be applied to ink droplets R with inhibited air resistance and inertia force acting on the ink droplets R. Therefore, more excellent wiring can be formed to electrically connect each laminated substrate 11.

Further, the potential difference produced between the print head 2 and the substrates 11 is less than the insulation breakdown voltage of air, resulting in no electrical short circuit. Therefore, wiring formation can stably be carried out.

Further, at least 2 ink droplets R are deposited on each bump portion of the step-like portions of a substrate unit 10, and thereby differently from the case of depositing one ink droplet R, the ink I is prevented from becoming wet and spreading in the bump portion to a large extent. Therefore, high precision wiring can be formed to electrically connect each laminated substrate 11.

Further, if ink droplets R are ejected at a constant ejection frequency $f_1$, under a single print head 2 drive condition, ink droplets R can be ejected at an adequate amount to be deposited on the side surfaces of the substrates 11 where ink droplets R are hard to deposit. Therefore, under simple print head 2 drive conditions, excellent wiring can certainly be formed to electrically connect each laminated substrate 11.

Further, when ink droplets R are ejected as the ejection frequencies $f_1$ and $f_2$ are appropriately switched, an appropriate amount of ink droplets R can be ejected on the upper surfaces of the substrates 11 where ink droplets R are easy to deposit as ink droplets R are ejected at an adequate amount to be deposited on the side surfaces of the substrates 11 where ink droplets R are hard to deposit. Thereby, excellent wiring can certainly and efficiently be formed to electrically connect each laminated substrate 11.

Modified Example

Subsequently, an ink-jet apparatus 1A as a modified example of the ink-jet apparatus 1 according to the above-described embodiment will now be described with reference to FIGS. 7 and 8.

Figure 7A:
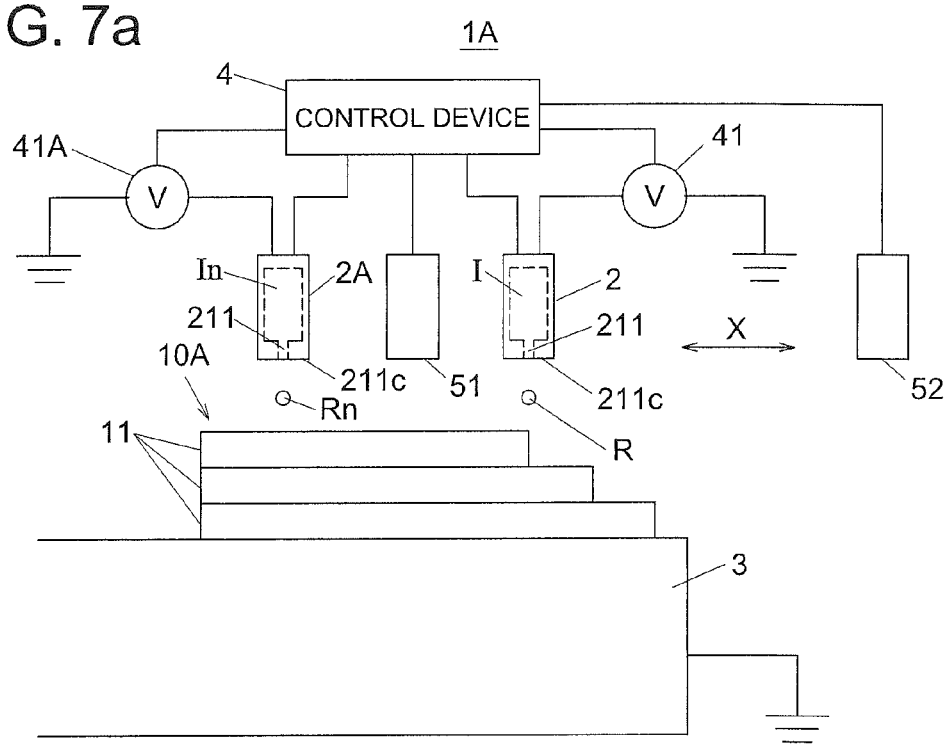
FIG. 7 includes (a) a schematic view showing one example of and (b) a schematic view showing another example of the entire constitution of an ink-jet apparatus in a modified example of the embodiment.
Figure 7B:
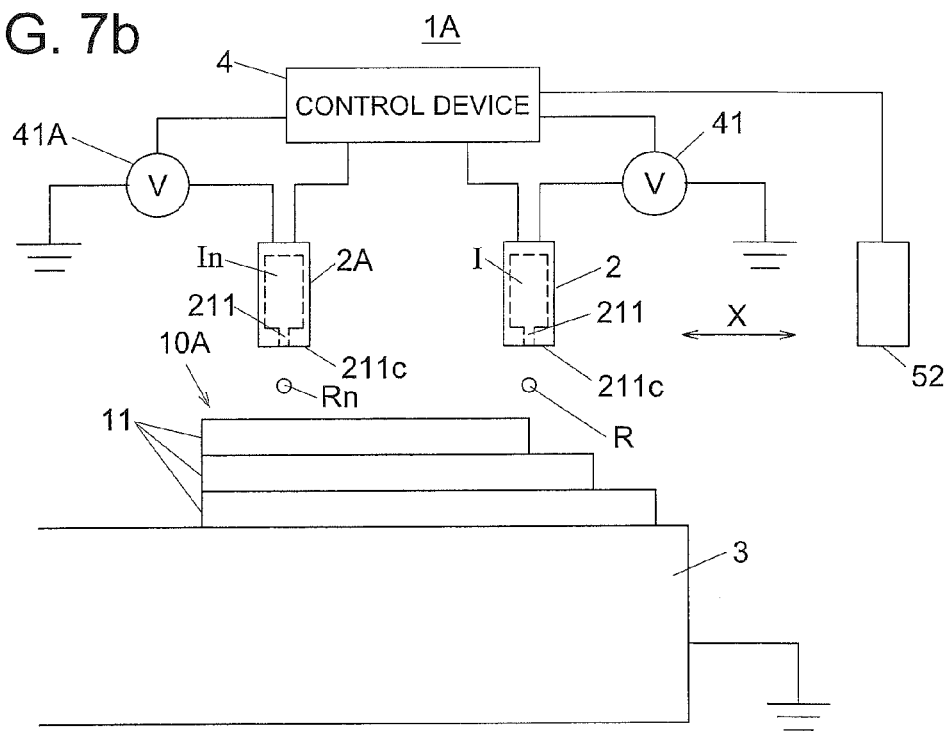
Figure 8:
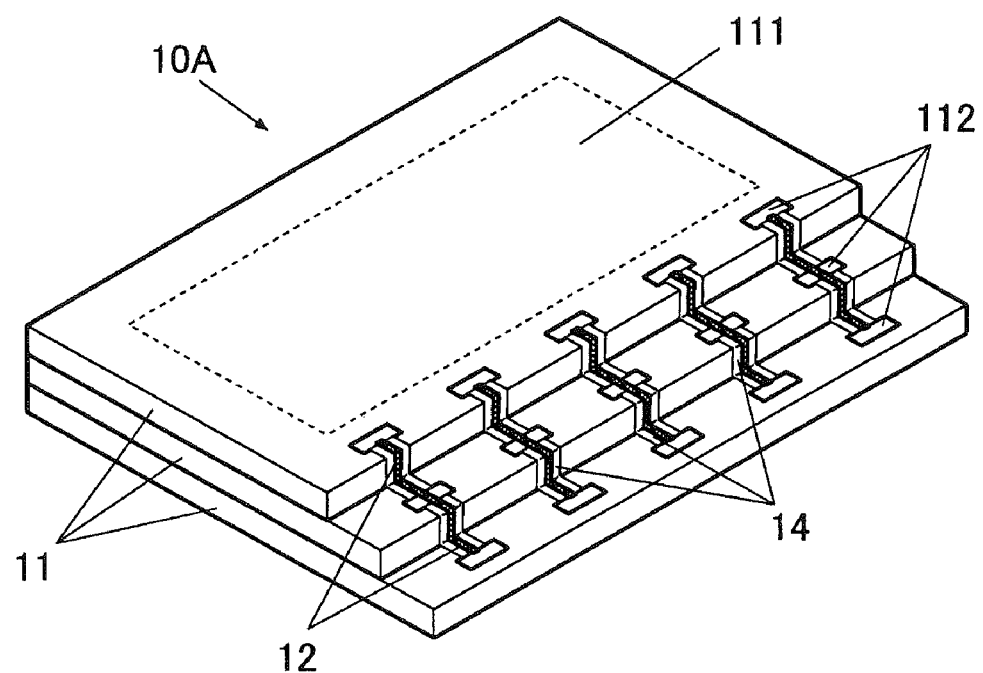
FIG. 8 is a perspective view of a substrate unit in the modified example of the embodiment.

FIG. 7 is a schematic view showing the entire constitution of the ink-jet apparatus 1A, and FIG. 8 is a perspective view of a substrate unit 10A to be described later.

As shown in FIG. 7A, in addition to the constitution of the in-jet apparatus 1 in the above embodiment, the ink-jet apparatus 1A is provided with a print head 2A for insulating layer formation, an electrostatic voltage power source 41A to apply an electrostatic voltage to the print head 2A, a dryer 51 to dry an insulating layer 14 to be described later, and a dryer 52 to dry a conductive layer 12, the ink-jet apparatus 1A carrying out wiring formation with respect to the substrate unit 10A instead of the substrate unit 10 in the above embodiment.

The print head 2A is constituted in the same manner as the print head 2 in the above embodiment. Herein, the print head 2A ejects an ink L containing an insulating material as ink droplets $R_n$ from its nozzle 211, instead of an ink $I_n$ containing a conductive material. This print head 2A forms an insulating layer 14 on the step-like portions of the substrate unit 10A to insulate the substrates 11 and a conductive layer 12 (refer to FIG. 8).

The Ink $I_n$ contains a resin composition as an insulating material. As such a resin composition, any resin compositions may be used as long as they contain a material exhibiting electrical insulating properties. For example, included are compositions containing a monomer, an oligomer, a polymer, and the like, which composes resins such as epoxy resin, phenol resin, polyimide resin, polyamide resin, polyamide-imide resin, silicone modified polyamide-imide resin, polyester resin, cyanate ester resin, BT resin, acrylic resin, methacrylic resin, melamine resin, urethane resin, and alkyd resin. These compositions may be used alone or in combination of at least two kinds thereof. The above resin composition is preferably contains a heat curable resin. The insulation layer 14 composed of cured products of the ink $I_n$ containing the heat curable resin is superior in heat-resisting property, insulation reliability, and connection reliability.

In a modified example of the present embodiment, among the above-described resins, the above resin composition particularly preferably contains the epoxy resin. Using the epoxy resin can improve adhesion properties to the conductive layer 12.

The epoxy resin includes, for example, bisphenol A type epoxy resin, bisphenol F type epoxy resin, bisphenol S type epoxy resin, bisphenol type epoxy resin, cycloaliphatic epoxy resin, aliphatic chain epoxy resin, glycidyl ester type epoxy resin, and glycidyl ether compounds prepared by a condensation reaction between a phenol compound and an aldehyde compound. These epoxy resins may be contained in combination of at least two kinds thereof. Further, in a modified example of the present embodiment, the above resin composition preferably contains the above epoxy resin and a hardener which hardens the epoxy resin.

The hardener includes, for example, amines such as diethylenetriamine, triethylenetetramine, methaxylenediamine, diaminodiphenylmethane, diaminodiphenylsulfone, m-phenylenediamine, dicyandiamide; acid anhydrides such as phthalic anhydride, tetrahydro phthalic anhydride, hexahydro phthalic anhydride, methyltetrahydro phthalic anhydride, methylhexahydro phthalic anhydride, methyl nadic anhydride, pyromellitic anhydride, trimellitic anhydride; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenyl imidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, and 2-phenyl-4-methylimidazoline; imidazoles in which an imino group is masked by acrylonitrile, phenylene diisocyanate, toluidine isocyanate, naphthalene diisocyanate, methylene bisphenyl isocyanate, melamine acrylate, and the like; phenol compounds such as bisphenol F, bisphenol A, and bisphenol S; and condensation products of phenol compounds and aldehyde compounds. These hardeners may be incorporated alone or in combination of at least two kinds thereof. Further, in the resin composition, there may be contained various additives such as a hardening accelerator, a coupling agent, an antioxidant, and a filler, in accordance with desired properties and condition, in addition to the above-described constituents.

As the solvent of the ink $I_n$, any solvents may be used as long as they disperse or dissolve the constituents of the above resin composition, and examples thereof include γ-butyrolactone, and cyclohexanone.

The viscosity of the ink $I_n$ is preferably at most 20 mPa·s at the ejection temperature, more preferably 2-8 mPa·s. When the viscosity is lower than 2 mPa·s, the concentration of the ink $I_n$ becomes smaller, whereby it may take longer to carry out curing. Further, when the viscosity is higher than 8 mPa·s, ejection failure may occur. Similarly to the ink I, the ejection temperature is preferably 20-60° C., more preferably 25-50° C.

The surface tension of the ink $I_n$ is preferably at least 20 mN/m, more preferably 25-45 mN/m. In the case of less than 25 mN/m, wetting/spreading occurs on ejection, whereby ejection may be hard to carry out. In contrast, in the case of more than 45 mN/m, the ink $I_n$ tends not to be filled.

The electrical conductivity of the ink $I_n$ is preferably at least 0.1 μS/cm at 25° C. to allow electrostatic attraction force to act, being, however, more preferably at least 1 μS/cm from the viewpoint of high precision drawing.

The specific dielectric constant of the ink $I_n$ is preferably at least 10.

The electrostatic voltage power source 41A is constituted in the same manner as the electrostatic voltage power source 41 in the above embodiment. However, instead of the print head 2, the print head 2A is applied with an electrostatic voltage.

Both the dryer 51 and the dryer 52 are provided above the opposite electrode 3 and connected to the control member 4. These dryers 51 and 52 can blow hot air downward via control of the control member 4, and then this hot air dries an insulating layer 14 and a conductive layer 12 each.

As shown in FIG. 8, in addition to the constitution of the substrate unit 10 of the above embodiment, a substrate unit 10A is formed with an insulating layer 14 to insulate substrates 11 and a conductive layer 12 by a method to be described later.

Subsequently, a wiring forming method to form a conductive layer 12 and an insulating layer 14 on a substrate unit 11 will now be described.

Initially, the following insulating layer forming step is performed to deposit ink droplets $R_n$, becoming an insulating layer 14, on a substrate unit 10A from the print head 12A of the ink-jet apparatus 1A.

This insulating layer forming step is performed in the same manner as the above-described conductive layer forming step. Namely, in the state when an electrostatic field is generated between the nozzle plate 21 of the print head 2A and the opposite electrode 3, ink droplets $R_n$ are ejected. Therefore, by applying an electrostatic attractive force, moving toward the substrates 11, to ink droplets $R_n$ having been ejected from the print head 2A, ink droplets $R_n$ can continuously be deposited even on the side surfaces of the substrates 11 having a steep angle with respect to the ink ejection surface 211c of the print head 2A without providing a taper member to reduce the angle. Especially, an adequate amount of ink droplets $R_n$ can be deposited on the angular portions where electrical force lines are concentrated.

In this case, an insulating layer 14 is preferably formed only in a portion when a conductive layer 12 is formed. Thereby, an insulating layer 14 is formed only in a portion required to be insulated and the insulating layer 14 can efficiently be formed.

Next, the insulating layer 14 is fired. The opposite electrode 3 is shifted, whereby the substrate unit 10 is positioned below the dryer 51. Then, the dryer 51 blows hot air downward via control of the control member 4 to dry and then fire the insulating layer 14 of the substrate unit 10.

Then, a surface treatment step is performed. In this step, the surface of the insulating layer 14 is surface-treated to enhance contact properties of ink droplets $R_n$.

The surface treatment method includes a chemical method and a physical method as described in, for example, sections 2 and 3 of chapter 2 of "Hyomen Shori Gijutu Handbook (Surface Treatment Technology Handbook)" (published by NTS Inc., Jan. 7, 2000). Further, the treatment can also be carried out by combination of both methods. A chemical method is employed in the modified example of the present embodiment.

Of the chemical methods, treatment using a coupling agent is preferable since during electronic device production, contact problems exist and then small film thickness is preferable. As this coupling agent, for example, silane-based, titanate-based, aluminum-based, and zirconium-based coupling agents are listed. The concentration of such a coupling agent is preferably 0.005-30% by weight, more preferably 0.01-5% by weight to realize formation of a film exhibiting excellent wettability and uniformity. As the coating method, any appropriate existing method such as an ink-jet, dipping, spray coating, or spin coating method is usable. Herein, the physical method includes plasma treatment, corona treatment, and UV treatment. Any of these can be applied at the extent that a preexistent insulating layer on the substrates 11 is not destroyed.

In this manner, the insulating layer 14 is surface-treated, whereby contact properties of ink droplets $R_n$ are enhanced and also the wetting and charged state of the ink droplets $R_n$ can be uniformed, Next, a conductive layer forming step is performed. This step is carried out in the entirely same manner as in the above embodiment.

Then, a conductive layer 12 is fired. The opposite electrode 3 is shifted, whereby the substrate unit 10 is positioned below the dryer 52. Then, the dryer 52 blows hot air downward via control of the control member 4 to dry and then fire the conductive layer 11 of the substrate unit 10. Temperature conditions during firing are the same as in the above embodiment.

Incidentally, as shown in FIG. 7B, the ink-jet apparatus 1A may be constituted without the dryer 51. In this case, firing of the insulating layer 14 is omitted.

As described above, according to the wiring forming method in the modified example of the present embodiment, it goes without saying that the same effects as in the above embodiment can be produced, and also ink droplets $R_n$ can continuously be deposited even on the side surfaces of the substrates 11 having a steep angle with respect to the ink ejection surface 211c of the print head 2A without providing a taper member to reduce the angle. Especially, an adequate amount of ink droplets $R_n$ can be deposited on the angular portions where electrical force lines are concentrated. Therefore, miniaturization of the substrate unit 10A can be realized with formation of an excellent insulating layer 14 on each laminated substrate 11 to insulate the substrates 11 and a conductive layer 12.

Further, since ink droplets $R_n$ are ejected in the state of applying a voltage between the print head 2A and substrates 11, compared to the conventional on-demand ink-jet head with no applied electrostatic attractive force, the flying distance of ink droplets $R_n$ can be extended. Therefore, high loading of substrates 11 can be realized.

Further, the ink $I_n$ has an electrical conductivity of at least 0.1 μS/cm and a specific dielectric constant of at least 10, and an ink droplet $R_n$ to be ejected has a volume of 0.001 pl-1 pl. Thereby, an attractive force adequate for deposition on the substrates 11 along electrical force lines can be applied to ink droplets $R_n$ with inhibited air resistance and inertia force acting on the ink droplets Rn. Therefore, an excellent insulating layer can be formed on each laminated substrate 11 to insulate the substrates 11 and a conductive layer.

Further, an insulating layer 14 is formed only in a portion required to be insulated, whereby the insulating layer can efficiently be formed.

Further, an insulating layer 14 is formed using a single resin composition, that is, an insulating material, whereby the wetting and charged state of ink droplets R to form a conductive layer 12 on the insulating layer 14 becomes uniform. Therefore, excellent wiring can stably be formed to electrically connect each laminated substrate 11.

Further, the surface of the insulating layer 14 is surface-treated to enhance contact properties of ink droplets R, whereby contact properties of the ink droplets R are enhanced and also the wetting and charged state of the ink droplets R becomes uniform. Therefore, excellent wiring can stably be formed to electrically connect each laminated substrate 11.

EXAMPLES

Example 1

The present invention will now specifically be described with reference to examples.

<Substrate Unit>

A conductive layer 12 and an insulating layer 14 were formed on the following substrate unit 10A under varied forming conditions for wiring state evaluation.

An electrode 112 is made of aluminum of □60 μm, and 10 thereof are placed for each substrate 11. The total drawing length between the electrodes 112 of each substrate 11 is 1.5 mm. The substrates 11 are covered with an insulating layer expect the side surfaces thereof. The thicknesses of the substrates 11 were 100 μm, 150 μm, and 50 μm in the order from the top. Namely, in above Expressions (1) and (2), $L_1$=250 μm and $L_2$=1.25 mm.

<Print Head>

Five types of Si heads having nozzles 211 of different orifice diameters S1 were used. Two types of inks were used which were an ink $I_n$ for insulating layer formation on the substrate side surfaces and an Ag ink I for wiring among the electrodes 112. Further, the gap in the vertical direction between the upper surface of the top substrate 11 and the ink ejection surface 211c of the print heads 2 and 2A was set to be 1 mm-4 mm. Still further, the print heads 2 and 2A were grounded and a direct voltage was applied to the opposite electrode 3, and thereby the voltage between the upper surface of the top substrate 11 and the print heads 2 and 2A was allowed to vary to eject ink droplets R and $R_n$.

Further, as a comparative experiment, in the state of applying no voltage to the opposite electrode, ink droplets R and $R_n$ were ejected.

<Insulating Layer Formation and Firing>

As the ink $I_n$ for insulating layer formation, an ink produced by Hitachi Chemical Co., Ltd. was used. Physical properties of this ink $I_n$ are as follows: concentration: 9% by weight, viscosity: 3 mPa·s (25° C.), surface tension: 25 mN/m, electrical conductivity: 5 μS/cm, and specific dielectric constant: 31.

The print head 2A was scanned parallel to the side surfaces of the substrates 11 at a constant rate of 30 mm/s. In this case, under ejection conditions in which the volume of a ink droplet $R_n$ was 0.5 pl and the ejection frequency was 6 kHz, overlapping drawing was carried out 5 times. Thereafter, the ink droplets $R_n$ were thermally cured at 180° C. for 60 minutes. Herein, the slope of the insulating layer after curing was approximately 70° from the upper surfaces of the substrates 11.

<Conductive Layer Formation and Firing>

As the Ag ink I, an ink produced by Sumitomo Electric Industries, Ltd. was used. Physical properties of this Ag ink I are as follows: concentration: 15%, viscosity: 13 mPa·s (25° C.), surface tension: 30 mN/m, electrical conductivity: 27 μS/cm, and specific dielectric constant: 25. Herein, this viscosity became at most 10 mPa·s during ejection of ink droplets R by heating the head.

The print head 2 was scanned at a constant rate of 30 mm/s. In this case, the diameter D on deposition of an ink droplet R was designated as the deposition diameter shown in Table 1 and r=0.5. Then, the ejection frequencies $f_1$ and $f_2$ calculated by above Expressions (1) and (2) were switched to carry out drawing. Thereafter, firing was carried out at 180° C. for 100 minutes.

<Evaluation>

In Table 1, shown are 12 patterns of forming conditions of the conductive layer 12 and the insulating layer 14, as well as the evaluation results of the wiring state of the conductive layer 12 in which 10 thereof were formed for each pattern. Herein, the wiring state of the conductive layers 12 was evaluated based on the following criteria: A: all the conductive layers 12 are conductive, and also wiring formation on the side surfaces is smooth and no loss influence is produced at high frequency; B: part of the conductive layers 12 are disconnected, and also wiring formation is wavy and a loss influence may be produced at high frequency; and C: all the conductive layers 12 are disconnected.

TABLE 1

|   | Voltage between Head and Substrate Top Surface [kV] | Ink Droplet Amount [pl]/Deposition Diameter [μm] | Gap between Head and Substrate Top Surface [mm] | Wiring State of Conductive Layer | Remarks |
| --- | --- | --- | --- | --- | --- |
| 1 | 2.9 | 1/24 | 1 | A | Inventive |
| 2 | 2.9 | 1/24 | 4 | A |  |
| 3 | 2.9 | 0.5/20 | 1 | A |  |
| 4 | 2.0 | 0.5/20 | 1 | A |  |
| 5 | 1.5 | 0.5/20 | 1 | A-B |  |
| 6 | 2.9 | 0.007/10 | 1 | A |  |
| 7 | 2.9 | 0.001/2 | 1 | A |  |
| 8 | 2.0 | 0.007/10 | 1 | A |  |
| 9 | 1.5 | 0.007/10 | 1 | A |  |
| 10 | 1.0 | 0.007/10 | 1 | A-B |  |
| 11 | 0 | 1/24 | 1 | C | Comparative |
| 12 | 0 | 0.5/20 | 1 | C |  |

Example 2

In Example 1, insulating layer formation and firing were changed as described below. Then, of 12 patterns in Table 1, with respect to 11 patterns, conductive layers 12 were formed for wiring state evaluation.

<Insulating Layer Formation and Firing>

Using a dispenser, drawing was carried out with an ink $I_n$ at a width of about 150 μm on the substrates 11 and also the bump portions were filled with the ink $I_n$. Then, the ink $I_n$ was thermally cured at 180° C. for 60 minutes.

<Evaluation>

In Table 2, shown are 11 patterns of forming conditions of the conductive layer 12, as well as the evaluation results of the wiring state of the formed conductive layer 12. Herein, the wiring state evaluation of the conductive layer 12 is the same as in Example 1.

TABLE 2

| | Voltage between Head and Substrate Top Surface [kV] | Ink Droplet Amount [pl]/Deposition Diameter [μm] | Gap between Head and Substrate Top Surface [mm] | Wiring State of Conductive Layer | Remarks |
|---|---|---|---|---|---|
| 1 | 2.9 | 2/32 | 1 | B-A | Inventive |
| 2 | 2.9 | 1/24 | 1 | A | |
| 3 | 2.9 | 1/24 | 5 | A | |
| 4 | 2.9 | 0.5/20 | 1 | A | |
| 5 | 2.0 | 0.5/20 | 1 | A | |
| 6 | 1.5 | 0.5/20 | 1 | A | |
| 7 | 1.0 | 0.5/20 | 1 | B | |
| 8 | 2.9 | 0.007/10 | 1 | A | |
| 9 | 2.9 | 0.001/2 | 1 | A | |
| 10 | 0 | 1/24 | 1 | C | Comparative |
| 11 | 0 | 0.5/20 | 1 | C | |

Example 3

Under the same forming conditions of a conductive layer 12 and a insulating layer 14 as in Example 1, a conductive layer 12 was formed on a substrate unit 10 in which substrates 11 were laminated by matching the outer circumferences thereof as shown in FIG. 2C for wiring state evaluation.

<Evaluation>

In Table 3, shown are forming conditions of the conductive layer 12 and the insulating layer 14, as well as the evaluation results of the wiring state of the formed conductive layer 12. Herein, the wiring state evaluation of the conductive layer 12 is the same as in Example 1.

TABLE 3

| | Voltage between Head and Substrate Top Surface [kV] | Ink Droplet Amount [pl]/Deposition Diameter [μm] | Gap between Head and Substrate Top Surface [mm] | Wiring State of Conductive Layer | Remarks |
|---|---|---|---|---|---|
| 1 | 2.9 | 1/24 | 1 | A | Inventive |
| 2 | 2.9 | 1/24 | 4 | A | |
| 3 | 2.9 | 0.5/20 | 1 | A | |
| 4 | 2.0 | 0.5/20 | 1 | A | |
| 5 | 1.5 | 0.5/20 | 1 | A-B | |
| 6 | 2.9 | 0.007/10 | 1 | A | |
| 7 | 2.9 | 0.001/2 | 1 | A | |
| 8 | 2.0 | 0.007/10 | 1 | A | |
| 9 | 1.5 | 0.007/10 | 1 | A | |
| 10 | 1.0 | 0.007/10 | 1 | A-B | |
| 11 | 0 | 1/24 | 1 | C | Comparative |
| 12 | 0 | 0.5/20 | 1 | C | |

As shown in Examples 1-3 described above, the present invention makes it possible to form a conductive layer 12 exhibiting an excellent wiring state under a wide range of forming conditions.

Incidentally, in the present embodiment and its modified example, the print heads 2 and 2A and substrate units 10 and 10A need only to be relatively shifted in the X direction. For example, employable is a constitution in which substrate units 10 and 10A are scanned with respect to non-scanned line-type print heads 2 and 2A.

Further, the print heads 2 and 2A need only to be relatively shifted approximately parallel to at least the upper surfaces of substrates 11. For example, it is possible that the print heads 2 and 2A are shifted approximately parallel to the upper surfaces of the substrates 11 and thereafter shifted approximately parallel to the side surfaces of the substrates 11 via rotation of the ink ejection surface 211c.

Still further, also with regard to respects other than the above ones, it goes without saying that the present invention is not limited only to the above-described embodiment and its modified example and can appropriately be converted.

DESCRIPTION OF THE SYMBOLS 2 and 2A: print heads
10 and 10A: substrate units
11: substrate
12: conductive layer
14: insulating layer
112: electrode
211c: ink ejection surface
D: ink droplet diameter
$f_1$: ejection frequency
$f_2$: ejection frequency
I and $I_n$: inks
$L_1$: the total length of a conductive layer formed on the side surfaces of substrates
$L_2$: the total length of a conductive layer formed on the upper surfaces of substrates
r: a ratio of the radius direction maximum length to the diameter in a portion where ink droplets are overlapped
R and $R_n$: ink droplets
V: print head scanning speed

What is claimed is:

1. A wiring forming method in which an ink droplet of an ink having chargeability is ejected from a print head of an inkjet method and deposited on a plurality of substrates to form wiring to connect a plurality of the substrates, comprising steps of:

using a plurality of the substrates to be laminated having electrodes on an upper surface or a side surface of each substrate representing an exposed surface;

using a conductive ink having a conductive material as the ink;

ejecting the ink droplet of the conductive ink from the print head while at least the printing head or the plurality of the substrates are moved substantially parallel to the upper surface of the substrate in a state where a voltage is applied between the print head and the plurality of the substrates; and forming a conductive layer on the exposed surface so as to electrically connect the electrodes to one another among the substrates.

2. The wiring forming method of claim 1, wherein the conductive ink has an electrical conductivity of at least 0.1 µS/cm and a specific dielectric constant of at least 10, and an ink droplet of the conductive ink to be ejected has a volume of 0.001 pl-1 pl.

3. The wiring forming method of claim 1, wherein a voltage applied between the print head and a plurality of the substrates is less than the insulation breakdown voltage of air.

4. The wiring forming method of claim 1, wherein as a plurality of the substrates, substrates laminated so as for the end portions to be arranged in a staircase pattern are used and the maximum diameter on deposition of the ink droplet of the conductive ink to be ejected is at most half of each of step heights of the staircase pattern portions.

5. The wiring forming method of claim 1, wherein when a plurality of the substrates and the print head are relatively shifted approximately parallel to the upper surfaces of the substrates, the droplet of the conductive ink is ejected from the print head at an ejection frequency $f_1$ satisfying following Expression (1):

$$f_1 = V(L_1+L_2-rD)/\{DL_2(1-r)\}[\text{Hz}] \qquad (1)$$

wherein D represents the diameter on deposition of an ink droplet of the conductive ink to be ejected; $L_1$ represents the total length of the conductive layer formed on each of the side surfaces of a plurality of the substrates; $L_2$ represents the total length of the conductive layer formed on each of the upper surfaces of a plurality of the substrates; r represents a ratio of the radius direction maximum length of ink droplets to the diameter D in a portion where ink droplets of the conductive ink having been continuously deposited are overlapped; and V represents the relative speed of a plurality of the substrates and the print head.

6. The wiring forming method of claim 5, wherein when the conductive layer is formed on each of the side surfaces of a plurality of the substrates, the ink droplet of the conductive ink is ejected at an ejection frequency $f_1$ satisfying the Expression (1), and when the conductive layer is formed on each of the upper surfaces of a plurality of the substrates, the ink droplet of the conductive ink is ejected at an ejection frequency $f_2$ satisfying following Expression (2):

$$f_2 = V(L_1+L_2-rD)/\{D(L_1+L_2)(1-r)\}[\text{Hz}] \qquad (2).$$

7. The wiring forming method of claim 1, further comprising a step of forming an insulating layer prior to forming the conductive layer, in which using an insulating ink containing an insulating material as the ink, in the state of applying a voltage between the print head and a plurality of the substrates, while at least a plurality of the substrates or the print head are relatively shifted approximately parallel to the upper surfaces of the substrates, an ink droplet of the insulating ink is ejected from the print head to form an insulating layer on the exposed surface to insulate the substrates and the conductive layer.

8. The wiring forming method of claim 7, wherein the insulating ink has an electrical conductivity of at least 0.1 µS/cm and a specific dielectric constant of at least 10, and an ink droplet of the insulating ink to be ejected has a volume of 0.001 pl-1 pl.

9. The wiring forming method of claim 7, wherein the insulating layer is formed only in a portion where the conductive layer is formed.

10. The wiring forming method of claim 7, wherein the insulating layer is formed with a single insulating material.

11. The wiring forming method of claim 7, further comprising a step of treating a surface prior to the forming the conductive layer after forming the insulating layer.

12. The wiring forming method of claim 1, wherein the substrate is a semiconductor chip.

* * * * *